(12) United States Patent
White

(10) Patent No.: US 7,070,431 B1
(45) Date of Patent: Jul. 4, 2006

(54) METHOD AND APPARATUS FOR EJECTING A RISER CARD

(75) Inventor: Joseph M. White, Windsor, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/070,474

(22) Filed: Mar. 2, 2005

(51) Int. Cl.
*H01R 13/62* (2006.01)

(52) U.S. Cl. ........................ 439/160; 361/798; 361/754

(58) Field of Classification Search ................ 439/160, 439/159, 157; 361/798, 754, 788, 785
See application file for complete search history.

(56) References Cited

U.S. PATENT DOCUMENTS

| | | | | |
|---|---|---|---|---|
| 4,197,572 A | * | 4/1980 | Aimar | ........................ 361/755 |
| 4,875,867 A | * | 10/1989 | Hoo | ............................ 439/157 |
| 5,793,614 A | * | 8/1998 | Tollbom | ...................... 361/732 |
| 5,997,326 A | * | 12/1999 | Koradia et al. | ............. 439/160 |
| 6,796,817 B1 | * | 9/2004 | Wrycraft | .................... 439/160 |
| 6,796,818 B1 | * | 9/2004 | Kabat et al. | ................ 439/160 |
| 6,816,388 B1 | * | 11/2004 | Junkins et al. | ............. 361/801 |

* cited by examiner

*Primary Examiner*—Gary F. Paumen

(57) ABSTRACT

An ejector for ejecting a riser card detachably connected to a backplane board, said ejector comprising an elongated ejector lever comprising a first end for rotatable attachment to said riser card and a second end for ejecting said riser card by inducing rotation of said ejector lever about a pivot section disposed between said first and second ends of said ejector lever, and an elongated support post comprising a first end for contacting said backplane board and a second end for rotatably supporting said ejector lever at said pivot section of said ejector lever.

19 Claims, 10 Drawing Sheets

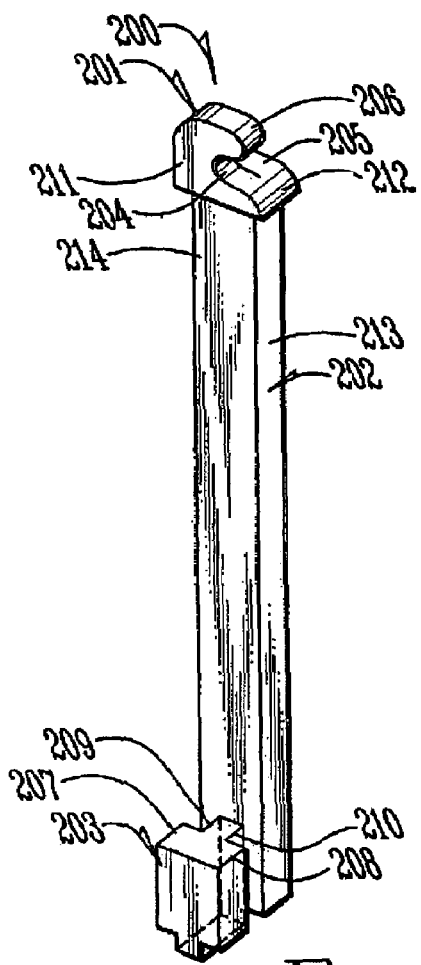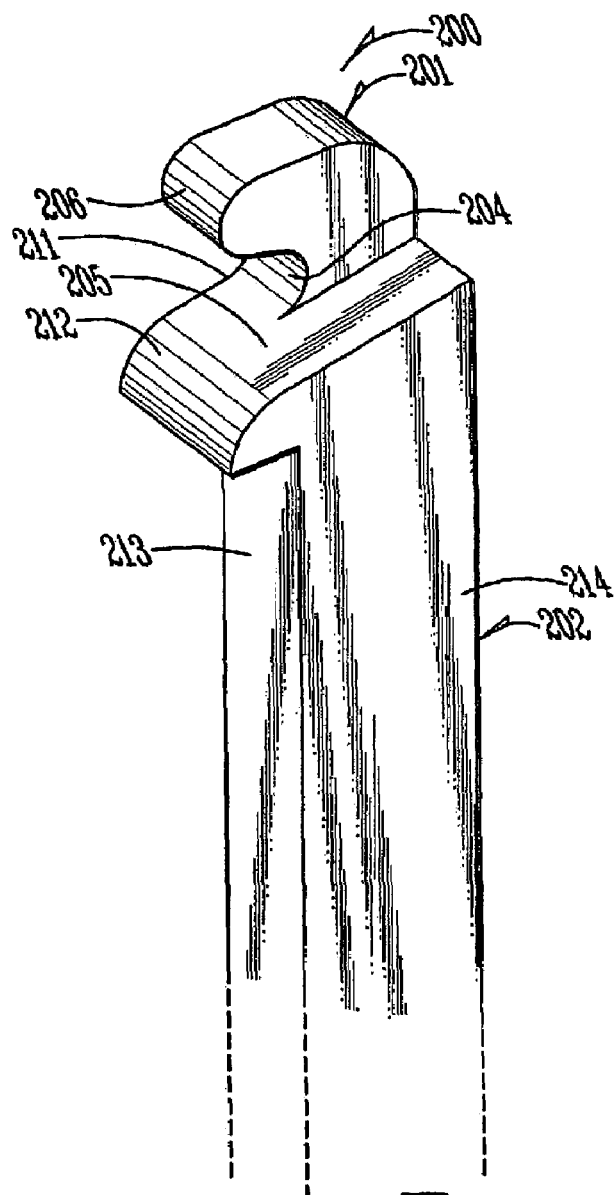
FIG. 4
FIG. 5

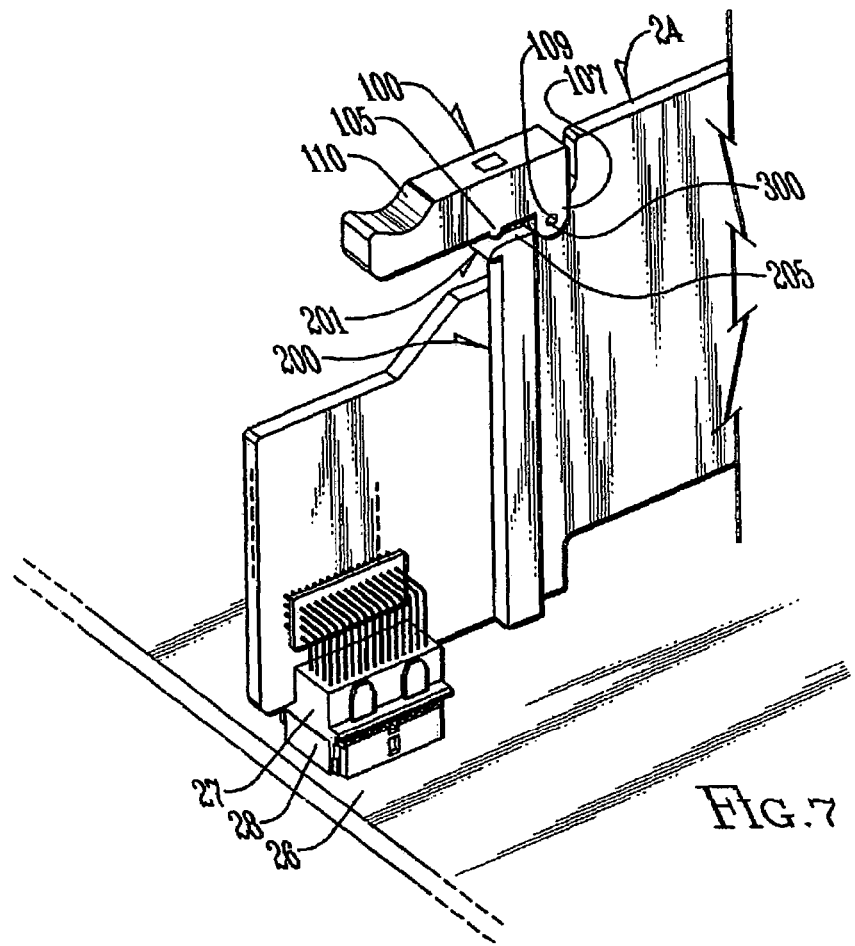
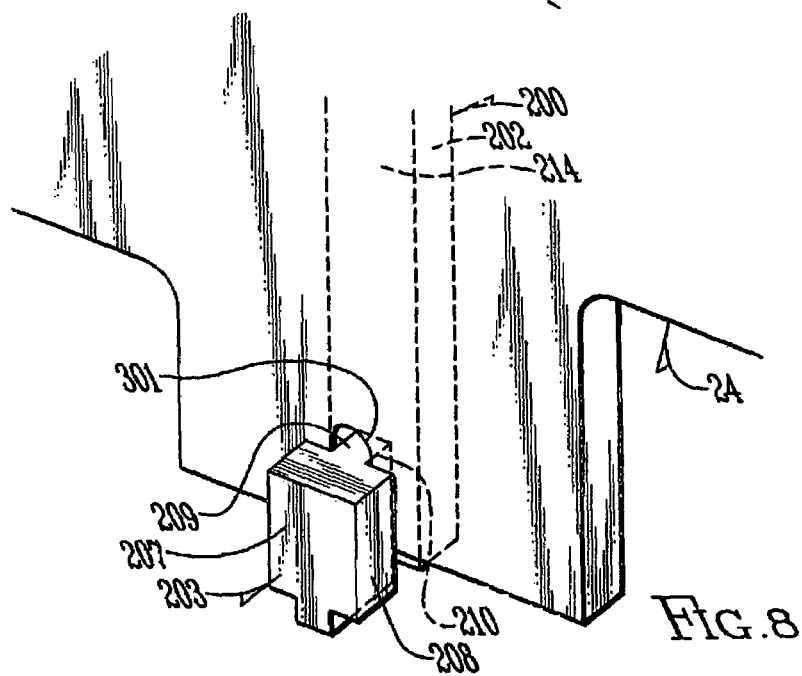

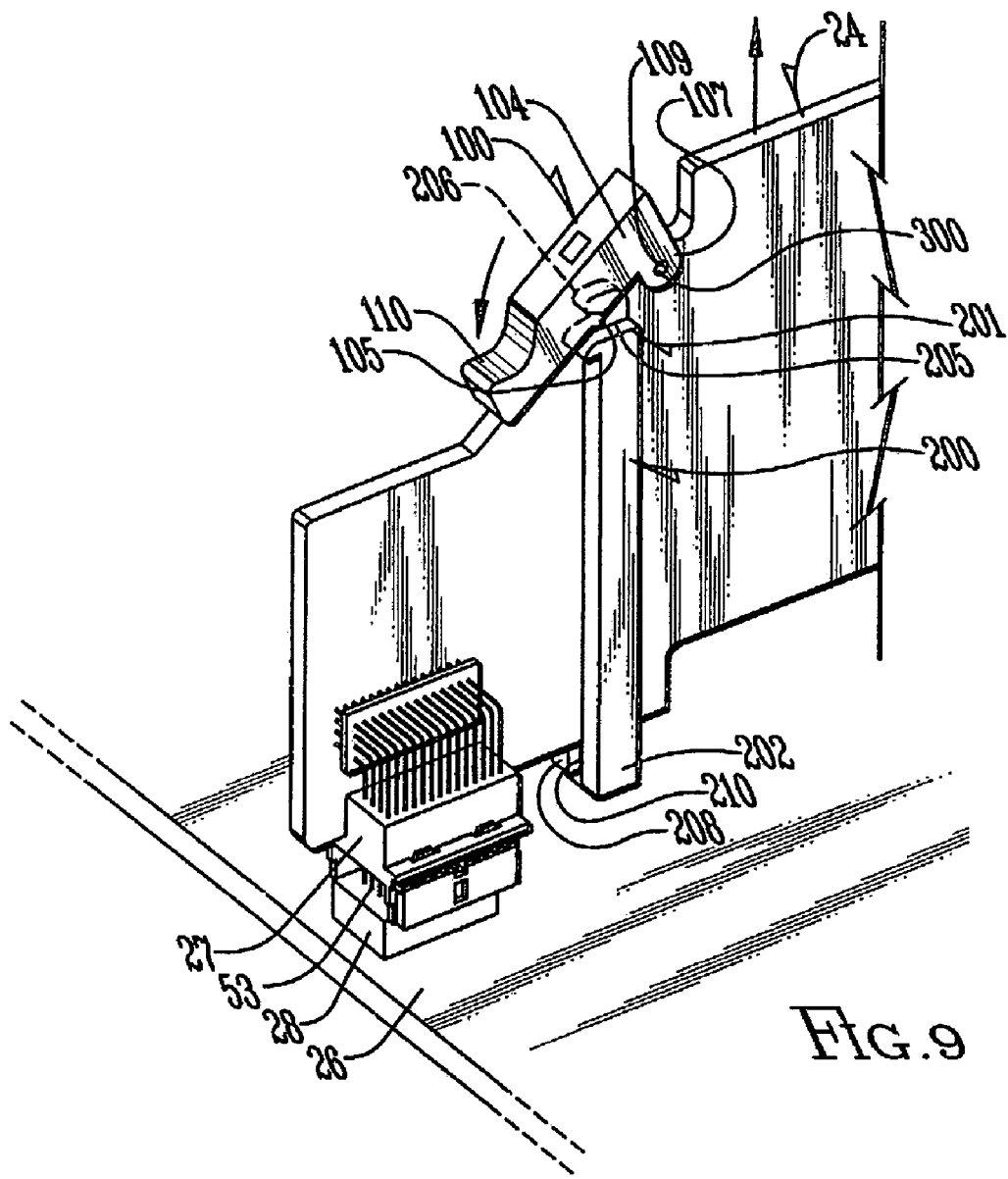

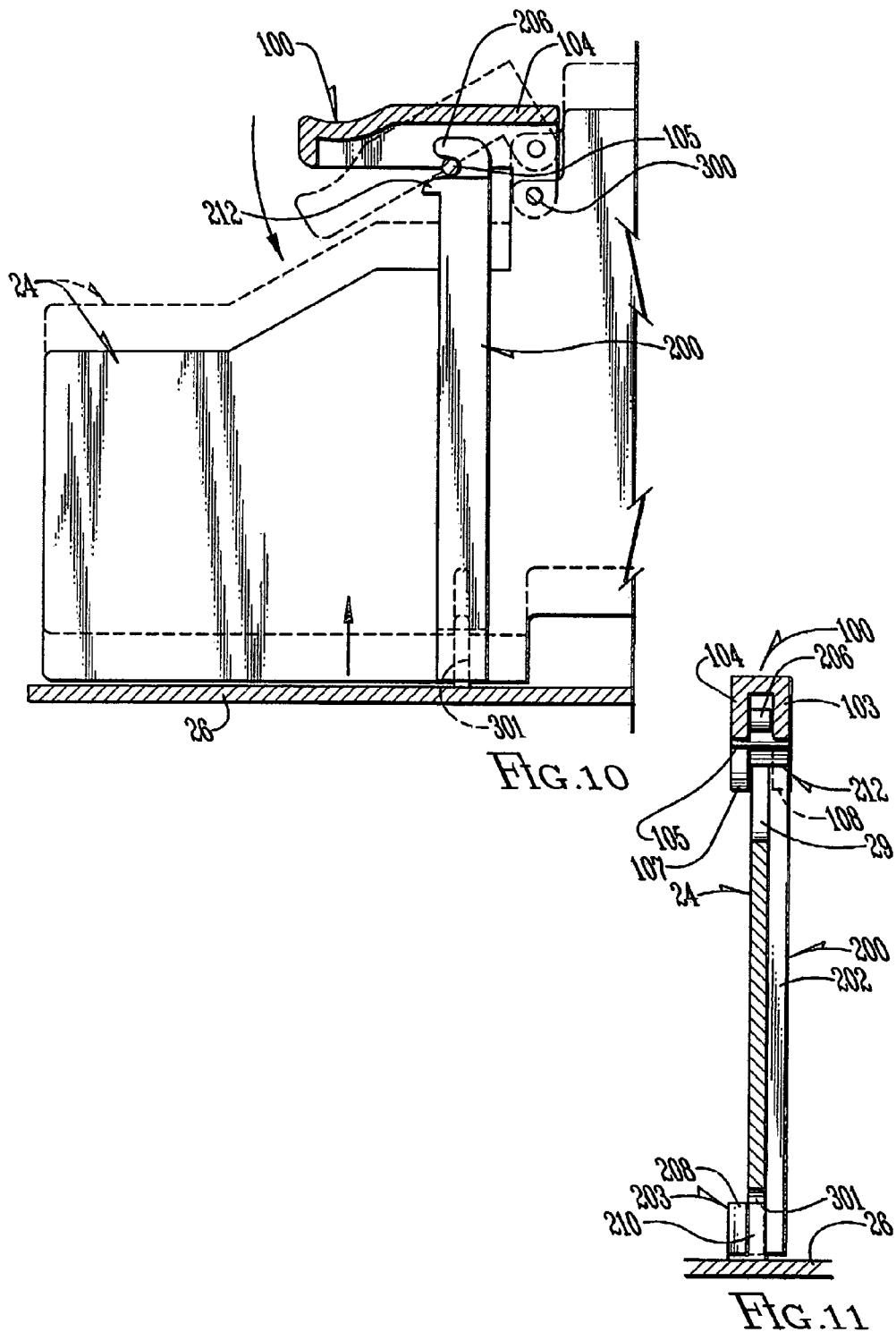

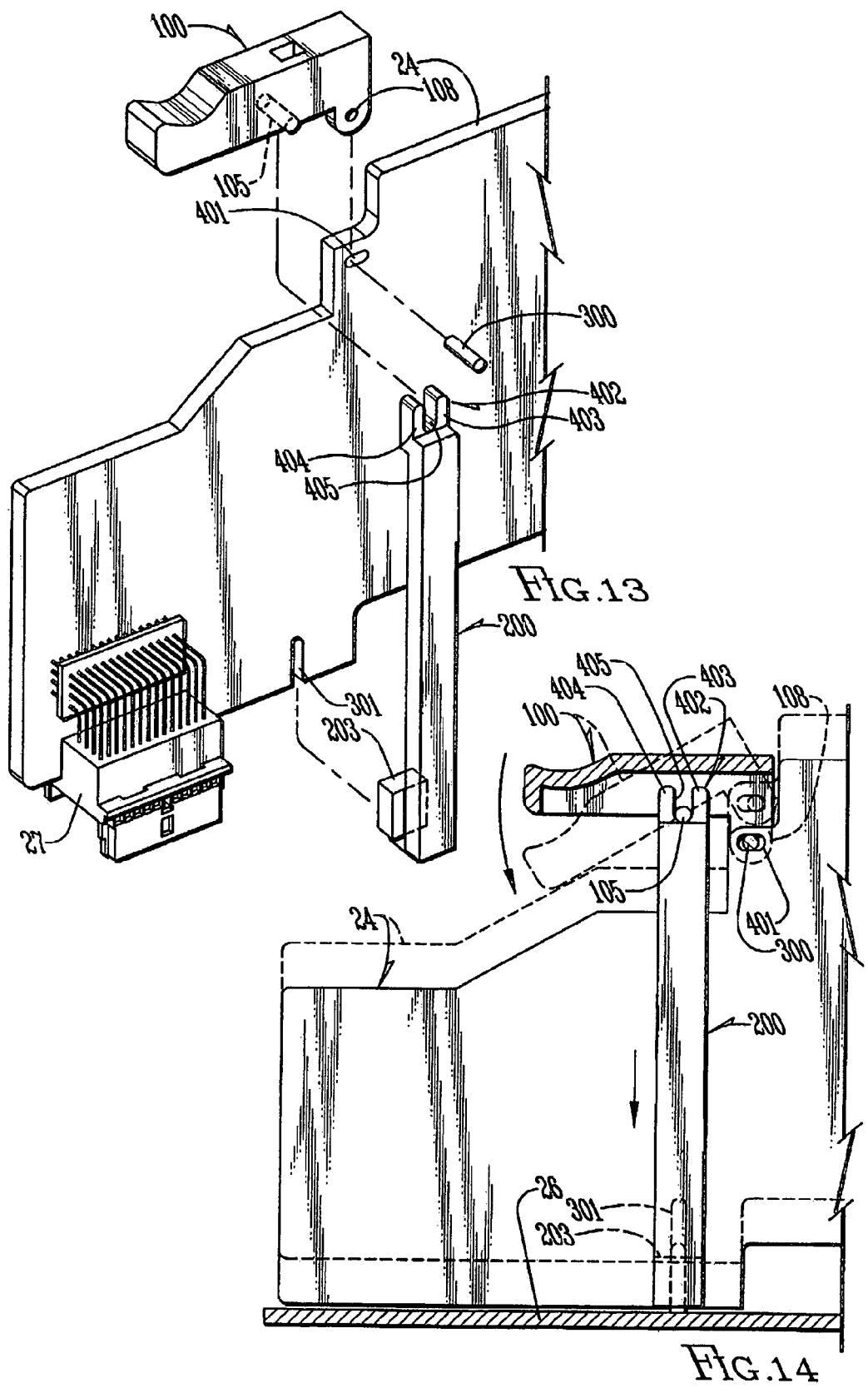

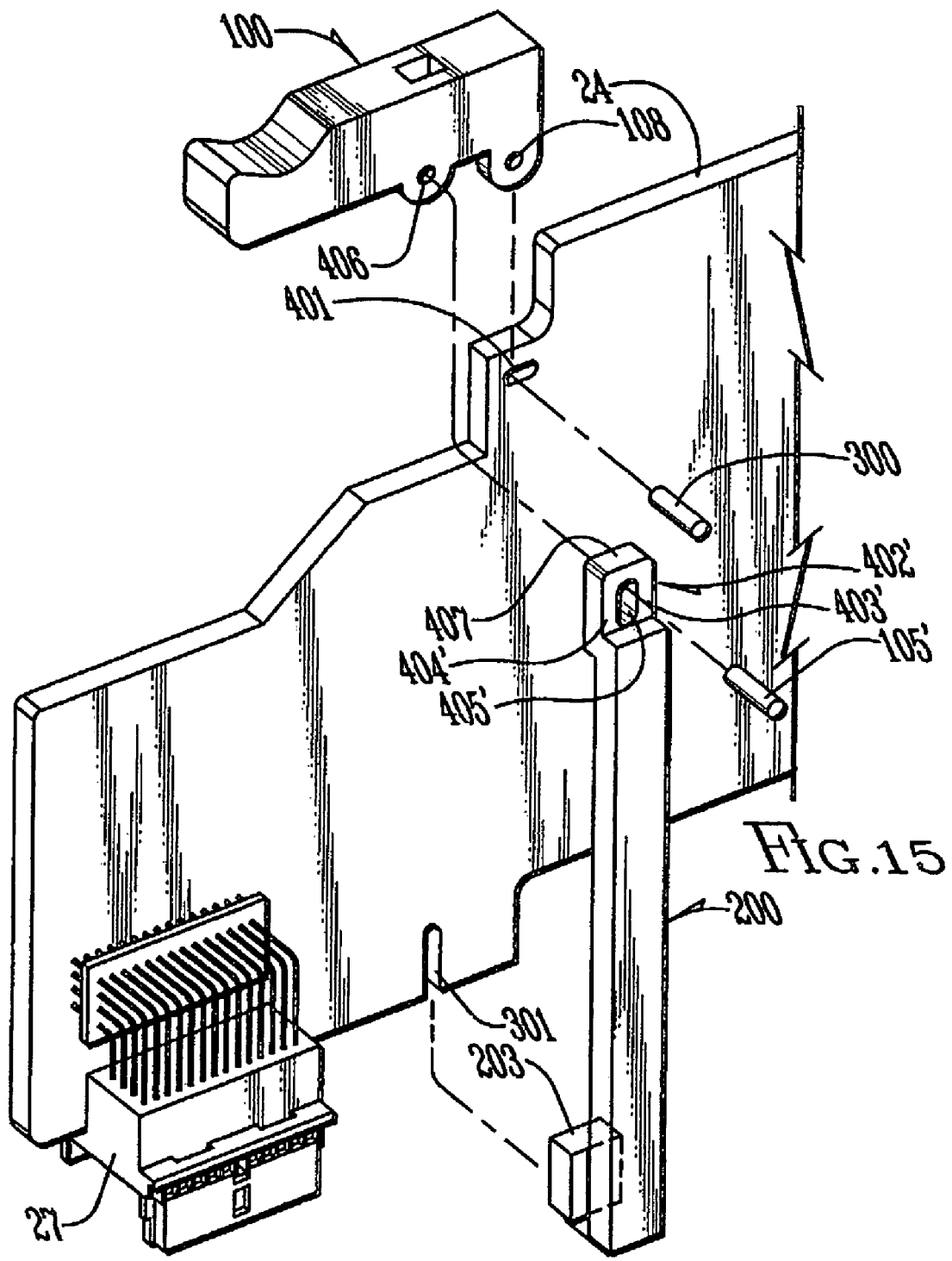

METHOD AND APPARATUS FOR EJECTING A RISER CARD

BACKGROUND OF THE INVENTION

1. Field of the Invention

This invention relates generally to a mechanism that facilitates the use of printed circuit boards with computer systems. More particularly, it relates to an ejector for ejecting a riser card from one or more connectors on a backplane board.

2. Discussion of the Related Art

Computer systems are provided with a processor and related circuitry. These are typically mounted on a backplane board within a computer chassis, sometimes referred to as a "motherboard." It is desirable in computer systems to enhance the capabilities of the backplane board by adding one or more riser cards, which are provided with electronic components that expand or enhance the capabilities of the backplane board.

Riser cards must be connected to backplane boards both electronically and physically. Numerous methods are used to accomplish this, one being the use of card-edge connectors. A typical card-edge connector is an elongate plastic body with a slot on the top face that runs along the longitudinal axis of the body. This slot is configured to receive a riser card. The inner edges of the slot are provided with a series of flexible contacts that mate with corresponding traces on the riser card as it is inserted into the connector. Each contact of the connector is connected to a pin (usually an integral part of the contact) that extends out the bottom face of the connector body. The pins are configured for insertion into corresponding holes in a backplane board and subsequently are soldered to provide a reliable electrical connection between the connector and the backplane board. Examples of card-edge connector are Tyco PN 650707-1 (101 dual position, PS/2 bus type) and FCI PN CEE2X60PF102PY4 (120 positions).

Another method to connect riser cards to backplane boards is to use header-receptacle combinations as shown in FIG. 1. The typical header 27 comprises a header block 51 that houses a series of pins 33, which extend from opposed sides of the header block. Pin ends 52 extend through an alignment card 58 and are inserted and soldered in corresponding holes 56 in a riser card. The other pin ends 53 are inserted into corresponding holes in a mating receptacle 28. The mating receptacle comprises a receptacle block 54 that house contacts for making electrical and physical connection with the pins of the header. Each contact 56 of the mating receptacle is connected to one end 56 of a pin 55 (usually an integral part of the contact) that extends out the bottom face of the receptacle body. The other end 57 of the pin is configured for insertion into a corresponding hole in a backplane board 26 and subsequently is soldered to provide a reliable electrical connection between the receptacle and the board. An example of a header is a Tyco Minitek® shrouded header PN 98464-G61-50U, while an example of a receptacle is Tyco Minitek® PCB receptacle PN 55510-350TR.

Most if not all methods of connecting a riser card to a backplane board suffer from a common problem. The contacts of the connector used to accomplish the connection between riser card and backplane board firmly grip the traces or pins with which they mate. This is necessary to insure a firm electrical connection between the card and board, as well as to promote physical stability for the card. However, the firm grip of the contacts typically makes it difficult to remove a riser card from a backplane board necessitating high extraction forces. Further, riser cards often have delicate componentry that must be handled manually, a particular problem where the circuitry is so tightly packed on the riser card such that there is little available area for grasping the riser card. This situation is exacerbated by the fact that riser cards are likewise often closely spaced to one another, magnifying the difficulties discussed above.

Various solutions to these problems have been proposed. One involves the inclusion of a built-in ejector in a riser card connector. This method, however, suffers from distinct disadvantages. First, having a built-in ejector adds cost and complexity to a standard connector. Second, many built-in ejector designs are difficult to use and hence do not provide a significant advantage over manually removing the card.

Another proposed solution is to place an ejector along the top edge of the riser card. This provides convenient access to the ejector when multiple cards are installed adjacent to one another. This also provides a lever ejector that only requires rotation in order to remove the riser card. However, this ejector arrangement requires an additional structure to provide a bearing surface for the lever. This structure is often placed on the backplane board and extends upward roughly the height of the riser card, adding cost and complexity. Further, securely attaching the structure to the backplane board to provide a stable bearing surface is difficult, and top-edge ejectors typically are relatively small and provide a limited mechanical advantage for disengaging a riser card.

Yet another card ejector, indicated generally at 10 in FIG. 1, uses a lever attached to the side of a riser card 24, which is positioned above backplane board 26. The lever 12 of the prior art ejector comprises an upper manipulation region 14, a lower abutting region 36, which presents a curved engagement tip 34 and an attachment means 22 for pivotably mounting the lever 12 to a side of the riser card 24. The lever is attached in such a position that the lower abutting region 36 extends beyond the lower edge of the riser card during pivoting of the lever. The riser-card ejector 10 is configured with a recess 29 along its upper edge to accept a pulling force to rotate the lever 12 about the attachment means 22 from an abutting position with riser card 24 (lever 12 in dotted lines) to an abutting position with a backplane board 26, unseating the header 27 of the attached riser card 24 from the mating receptacle 28 of the backplane board 26. This card ejector is problematic, however, when there is no sheet metal or other off-board interface against which the lower abutting region can press as ejection is accomplished. Backplane boards are often tightly packed with components, leaving no room for the lever to abut the board during ejection. If a board is designed to take the abutment region into account, fewer components may be placed on the backplane board.

SUMMARY

The embodiment shown and described is directed to a system for facilitating the use of printed circuit boards in electronic devices. The system comprises a backplane board, a riser card detachably connected to the backplane board, an elongate ejector lever comprising a first end attached to the riser card and a second end for ejecting the riser card by inducing rotation of the ejector lever about a pivot section disposed between the first and second ends of the ejector lever, and an elongate support post comprising a first end in contact with the backplane board and a second end rotatably supporting the ejector lever at the pivot section of the ejector lever.

Further, the embodiment shown and described is directed to a method for separating a backplane board from a detachable riser card. The method comprises the following steps: forming an elongated lever comprising a first end, a second end and a pivot section between the first and second ends, forming an elongated post having first and second ends, rotatably affixing the first end of the lever to the riser card, positioning the post so that the first end of the post contacts the backplane board and the second end of the post rotatably supports the pivot section of the lever, applying force to the second end of the lever so that the lever rotates about the pivot section, the first end of the lever applies ejection force to the riser card, and the riser card separates from the backplane board.

DESCRIPTION OF THE DRAWINGS

FIG. 4 depicts, in perspective, an exemplary embodiment of a support post of a riser-card ejector of the embodiment shown and described.

FIG. 5 depicts, in perspective, a detail of the support post of FIG. 4.

FIG. 7 depicts, in perspective, an assembled riser-card ejector of FIG. 6.

FIG. 8 depicts, in perspective, a detail of the riser-card ejector of FIG. 7.

FIG. 9 depicts the completion of an ejection of a riser card by the riser-card ejector of FIG. 7.

FIG. 10 depicts a side sectional view of the riser-card ejector of FIG. 7.

FIG. 11 depicts a front sectional view of the riser-card ejector of FIG. 7.

FIG. 13 depicts, in perspective, an assembly view of an alternative riser-card ejector.

FIG. 14 depicts a side sectional view of the riser-card ejector of FIG. 13.

FIG. 15 depicts, in perspective, an assembly view of an alternative riser-card ejector.

DETAILED DESCRIPTION OF THE DRAWINGS

Figure 2:
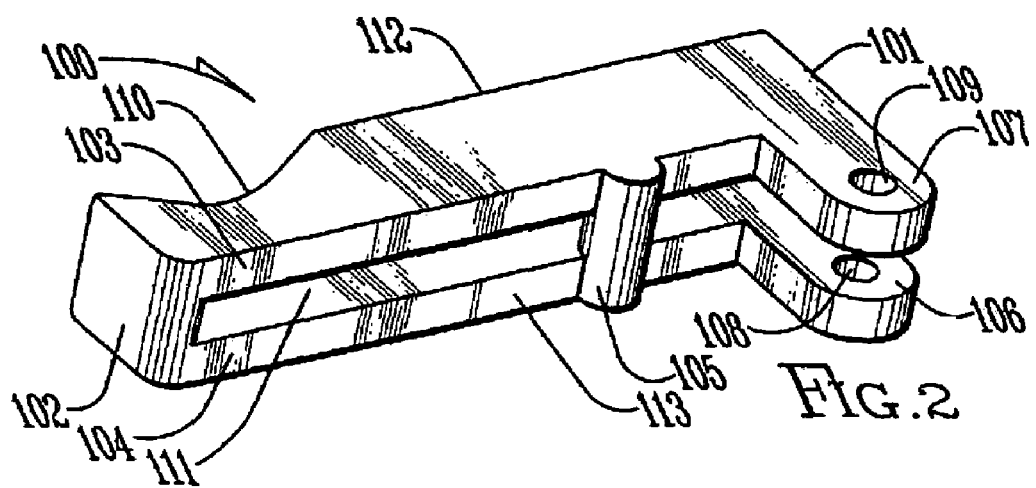
FIG. 2 depicts, in perspective, an exemplary embodiment for an ejector lever of a riser-card ejector of the embodiment shown and described.

FIG. 2 depicts an ejector lever 100 of a riser-card ejector of the embodiment shown and described. Ejector lever 100 comprises end wall 102, side wall 103, side wall 104 and top wall 112, which define a cavity 111. Lever end 101 and lever bottom 113 are open. Ejector lever 100 also comprises an integral rotation pin 105, which is a cylindrical member that bridges walls 103 and 104 of ejector lever 100 at lever bottom 113. The axis of rotation pin 105 is approximately aligned with the bottom edges of walls 103 and 104. As discussed below, the purpose of rotation pin 105 is to provide an axis of rotation for ejector lever 100 when it is used to eject a riser card from a backplane board. Indent 110 is a point at which pressure may be applied to induce rotation of ejector lever 100 about rotation pin 105.

Side wall 103 is provided with a semi-circular pivot extension 107 having a pivot hole 109 in its approximate center. Likewise, side wall 104 is provided with a semi-circular pivot extension 106 having a pivot hole 108 in its approximate center. These structural features are present to permit rotatable attachment of ejector lever 100 to a riser card. As discussed below, ejector lever 100 is rotatably secured to a riser card by positioning the card between pivot extensions 106 and 107 and inserting a pin first through one of pivot holes 108 and 109, next through a corresponding hole in the riser card, and last through the remaining pivot hole.

Figure 3:
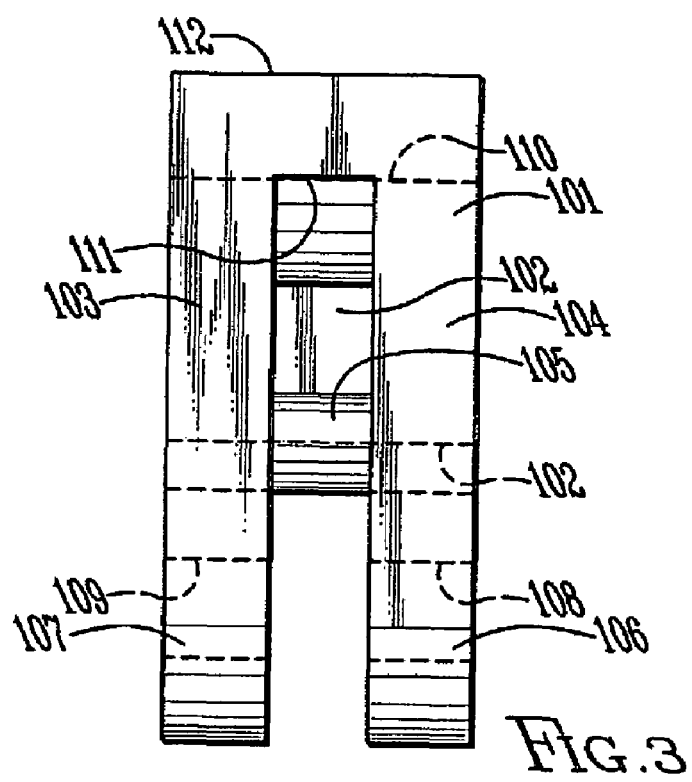
FIG. 3 depicts an end view of the ejector lever of FIG. 2.

The dimensions, features and materials of ejector lever 100 are a matter of design choice depending upon the application. The ejector lever may be solid rather than hollow. There need not be a rotation pin 105, pivot extensions 106 and 107, an indent 110 or other features depicted in FIGS. 2 and 3. While the material used in the ejector lever 100 of FIGS. 2 and 3 is plastic and the method of fabrication injection molding, other materials and fabrication methods may be used. For example, the ejector lever may be milled from aluminum in appropriate circumstances.

FIG. 4 depicts a support post 200 of a riser-card ejector of the embodiment shown and described. Support post 200 is configured to support ejector lever 100. Support post 200 comprises post top 201, post body 202 and card retention block 203. Post top 201 comprises rotation hook 206, support surface 205 and relief ramp 212. Rotation hook 206 is configured to accept rotation pin 105 of the ejection lever 100, which contacts rotation surface 204. Rotation hook 206 is approximately half the width of post top 201. Side surface 211 of post top 201 is offset from the same plane of surface 214 of post body 202 and thus surface 211 overhangs surface 214 of post body 202 by approximately the width of rotation hook 206. Likewise, relief ramp 212 overhangs surface 213 of post body 202 by a lesser amount.

Card retention block 203 is an approximately rectangular body that has been relieved to form extensions 207 and 208, both of which are spaced from surface 214 of post body 202, thereby defining retaining grooves 209 and 210. As discussed below, these grooves accept the walls of a slot in a riser card to mate the card with support post 200.

FIG. 5 depicts a detailed view of the other side of support post top 201. As shown, support surface 205 is a flat surface that extends from surface 214 of post body 202 to the start of relief ramp 212. Ejector lever 100 rests on support surface 205 when not in use.

The dimensions, features and materials of support post 200 are a matter of design choice depending upon the application. While the material used in the support post 200 of FIGS. 4 and 5 is plastic and the method of fabrication is injection molding, other materials and fabrication methods may be used.

Figure 1:
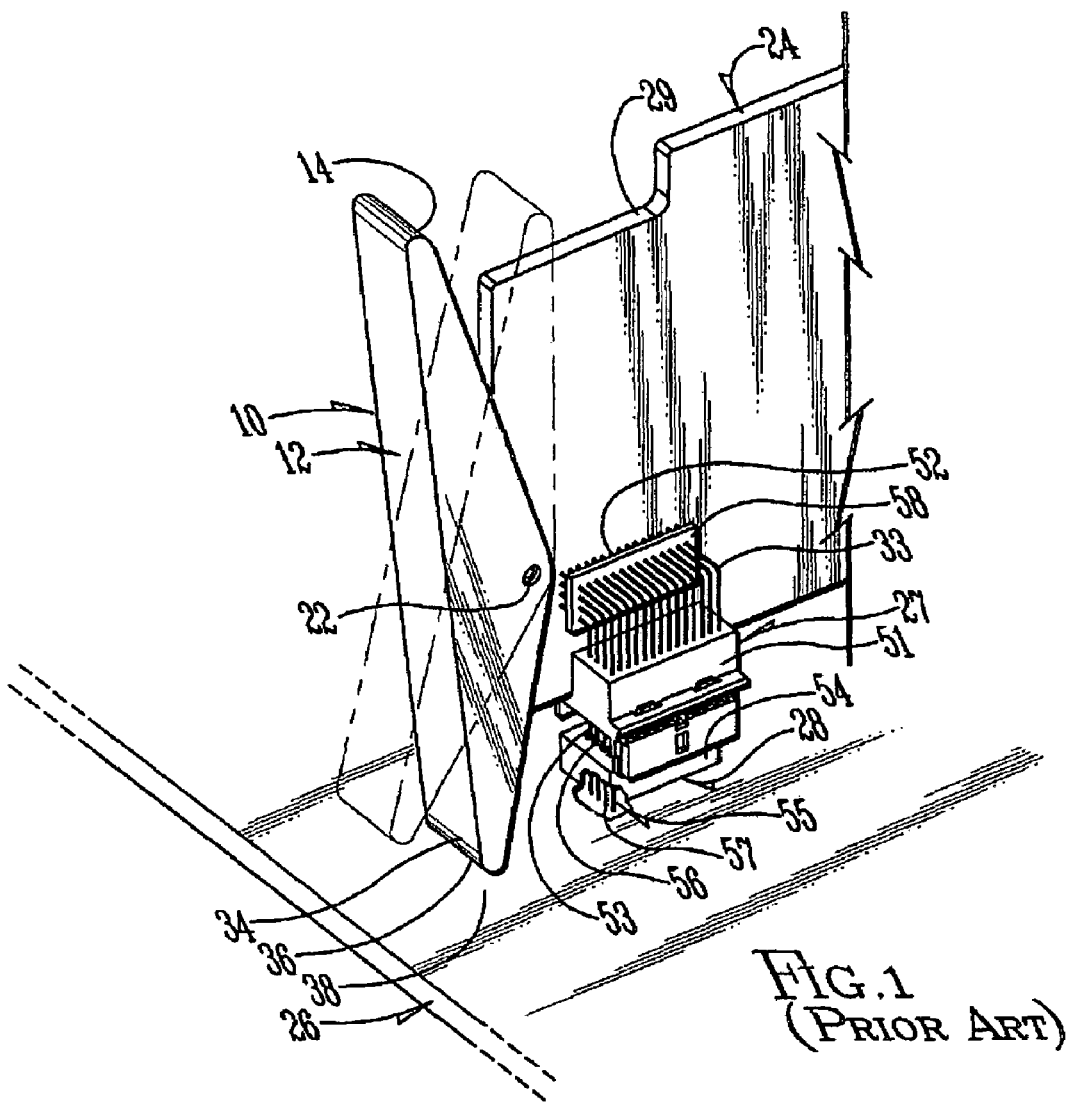
FIG. 1 depicts, in perspective, a riser-card ejector of the prior art.
Figure 6:
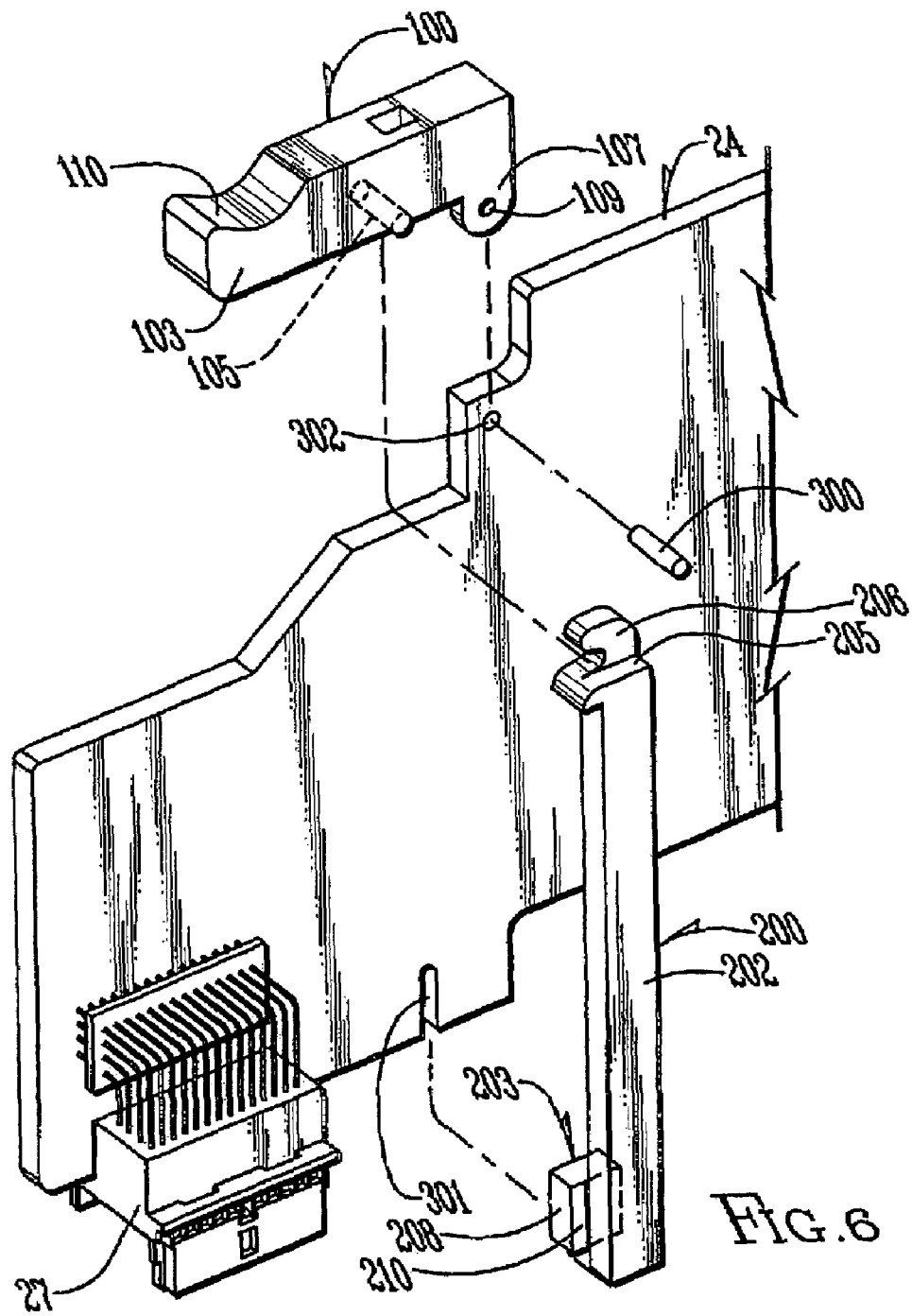
FIG. 6 depicts, in perspective, an assembly view of an exemplary embodiment of a riser-card ejector of the embodiment shown and described using the ejector lever of FIGS. 2 and 3 and the support post of FIGS. 4 and 5.

FIG. 6 depicts an assembly view of a riser-card ejector using the ejector lever of FIGS. 2 and 3 and the support post of FIGS. 4 and 5. The manner of action for this riser-card ejector differs from that of the prior art. By way of example, FIG. 1 depicts, in perspective, a prior art riser-card ejector 10. Header 27 is shown soldered in place to riser card 24. In this view, backplane board or mating receptacle are not shown. Riser card 24 is positioned above backplane board 26 and is connected to backplane board 26 both electrically and physically by header 27 and mating receptacle 28. The connectors, as mounted, require a linear extraction force in the plane of the riser card and outwardly of the backplane board to unseat header 27 of riser card 24 from mating receptacle 28 of backplane board 26. Header 27 can be disconnected from mating receptacle 28 by applying a disengaging force to header 27 lever 12 with consequent sweeping action of the lower abutting region 36. This sweeping motion imparts lifting force to separate the header 27 from mating receptacle 28. This force may be resolved into vertical and horizontal vector components, where only the vertical force is desired for lifting purposes. The horizontal component is not useful for lifting purposes and potentially damages a variety of elements, such as the header 27 or mating receptacle 28. In contrast to what is shown in FIG. 1, the vector resolution of direct vertical lifting force is improved by the riser-card ejector shown in FIG. 6. This is because support post 200 is attached to slot 301 of riser card 24 by card retention block 203. The opposed edges of slot 301 ride in retaining grooves 209 and 210 of card retention block, preventing separation of post body 202 from the riser card but permitting the riser card to slide in a vertical direction relative to post body 202 while avoiding or mitigating problematic horizontal forces, such as the sweeping forces of the prior art. Ejection lever 100 is positioned on post top 201. Rotation pin 105 of ejection lever 100 is placed in rotation hook 206, in contact with or in close proximity to rotation surface 204 of rotation hook 206. When so positioned, the longitudinal centerline of ejector lever 100 is aligned with the upper edge of riser card 24 and pivot extensions 106 and 107 may be positioned on opposite sides of riser card 24. Ejector lever 100 is rotatably secured to riser card 24 by, for example, positioning pivot extensions 106 and 107 on opposite sides of riser card 24 and inserting pin 300 first through pivot hole 109 of ejector lever 100, next through hole 302 in riser card 24, and last through pivot hole 108 of the ejector lever 100.

FIG. 7 depicts an assembled riser-card ejector of FIG. 6 in its operating environment. Header 27 is soldered to riser card 24. Mating receptacle 28 is soldered to backplane board 26. Riser card 24 has been connected to backplane board 26 by plugging header 27 into mating receptacle 28. Support post 200 rests on the upper surface of backplane board 26 and is slidably affixed to riser card 24 by card retention block 203, which mates with slot 301 of riser card 24 (not visible). Ejector lever 100 rests on post top 201 of support post 200, with rotation pin 105 of ejector lever 100 positioned within rotation hook 206 of post top 201. Ejector lever 100 is rotatably fastened to riser card 24 by pin 300, which passes through pivot holes 108 and 109 of pivot extensions 106 and 107 of ejector lever 100 and hole 302 of riser card 24.

FIG. 8 depicts a detail of the riser-card ejector of FIG. 7. In particular, FIG. 8 depicts the interaction between card retention block 203 of support post 200 and slot 301 of riser card 24. Riser card 24 is resting on the surface of backplane board 26, as is support post 200. Slot 301 is resting in the grooves formed by post body 202 and extensions 207 and 208 of card retention block 203. Extensions 207 and 208 maintain the engagement of riser card 24 and support post 200, but permit vertical movement of riser card 24 relative to support post 200 and the surface of backplane board 26.

FIG. 9 depicts the completion of an ejection of riser card 24 by the riser-card ejector of FIG. 7. Downward force was applied to ejector lever 100 at pressure indentation 110. This downward force caused ejection lever 100 to rotate about rotation pin 105, which was secured during rotation by rotation hook 206. As ejector lever 100 rotated, it applied lifting force to riser card 24 and through pin 300. Riser card 24 transmitted this lifting force to header 27, causing it to disconnect from mating receptacle 28 and accomplish ejection of riser card 24 from backplane board 26. Ejector lever 100 did not contact backplane board 26 before, during or after this operation FIG. 10 depicts a side sectional view of the riser-card ejector of FIG. 7. The status of the ejector before ejection is shown with solid lines and the status after ejection with dotted lines. Rotation pin 105 rotates within rotation hook 206 during ejection. Relief ramp 212 ensures that ejector lever 100 does not contact post top 201 as ejector lever rotates about rotation pin 105 during ejection.

FIG. 11 depicts a front sectional view of the riser-card ejector of FIG. 7. Post body 202 abuts riser card 24 and is slidably joined to riser card 24 by card retention block 203, which passes through slot 301 of riser card 24. Rotation hook 206 is centered over riser card 24. Rotation pin 105 is positioned in rotation hook 206, just above relief ramp 212. Pivot extensions 107 and 108 straddle riser card 24.

Figure 12:
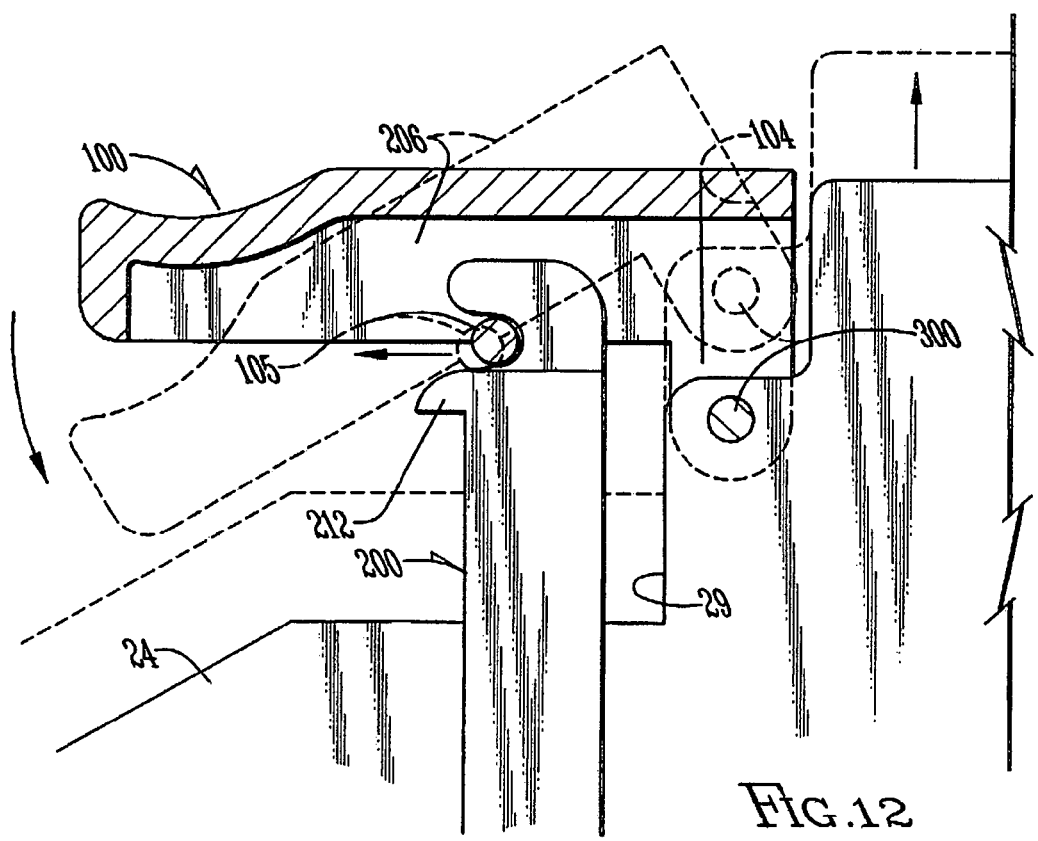
FIG. 12 depicts a detail of a side sectional view of the riser-card ejector of FIG. 7.

FIG. 12 depicts a detail of a side sectional view of the riser-card ejector of FIG. 7. The status of the ejector before ejection is shown with solid lines and the status after ejection with dotted lines. As shown, rotation pin 105 does not stay stationary at the back of the throat of rotation hook 206 during ejection of a riser card. Rather, rotation pin 105 moves horizontally out of rotation hook 206 to a limited extent, since the distance from the center of pin 300 to rotation hook 206 decreases as riser card 24 moves vertically during the ejection operation.

FIG. 13 depicts, in perspective, an assembly view of an alternative riser-card ejector. Rotation hook 206 has been replaced with retention fork 402 having vertical tines 403 and 404. Retention ramp 212 has been eliminated. Round hole 301 has been replaced with slot 401.

FIG. 14 depicts a side sectional view of the riser-card ejector of FIG. 13. The status of the ejector before ejection is shown with solid lines and the status after ejection with dotted lines. Rotation pin 105 rotates within retention fork 402 during ejection. It does not move horizontally during ejection. Instead, and for the reasons mentioned in the discussion of FIG. 12, pin 300 moves horizontally during ejection. As shown, pin 300 moves from the center of slot 401 to the right end of slot 401 as riser card 24 rises vertically during ejection.

FIG. 15 depicts, in perspective, an assembly view of an alternative riser-card ejector. Like numbering of identical parts is retained with respect to FIG. 13, and modified elements with respect to FIG. 13 are designated as prime ("'"). Ejection lever 100' is provided with a hole 406 for receipt of pin 105'. A modified retention fork 402' has vertical tines 403'and 404'. The modified retention fork 402' is provided with an upper closed end 407 that circumscribes pin 105' for improved retention of pin 105' within the modified retention fork 402'. Pin 105' may be placed within or removed from hole 406 for selective coupling between the ejection lever 100' and support post 200.

The dimensions, features and materials of the ejectors discussed above are a matter of design choice depending upon the application. For example, the connectors involved need not be headers and receptacles, but rather may be one or more of a wide variety known to the art, including edge connectors. There is nothing in the detailed description above that limits, is intended to limit, or that can limit the scope of this application or that of any patent that issues on this application. The scope of that coverage is limited only by the claims that follow.

What is claimed is:

1. An ejector for ejecting a riser card detachably connected to a backplane board, said ejector comprising:
an elongate ejector lever comprising a first end for rotatable attachment to said riser card and a second end for ejecting said riser card by inducing rotation of said ejector lever about a pivot section disposed between said first and second ends of said ejector lever; and
an elongate support post comprising a first end for contacting said backplane board and a second end for rotatably supporting said ejector lever at said pivot section of said ejector lever.

2. The ejector of claim 1 wherein said pivot section of said ejector lever comprises a rotation pin for providing a point of rotation of said ejector lever.

3. The ejector of claim 1 wherein said ejector lever comprises a first wall, a second wall spaced from said first wall, and a rotation pin disposed between said first and second walls in said pivot section of said ejector lever for providing a point of rotation of said ejector lever.

4. The ejector of claim 1 wherein said second end of said support post comprises a retention hook for securing said pivot section of said ejector lever during rotation.

5. The ejector of claim 1 wherein said second end of said support post comprises a retention fork for securing said pivot section of said ejector lever during rotation.

6. The ejector of claim 1 wherein said first end of said support post comprises a card retention block for slidably securing said first end to said riser card.

7. The ejector of claim 1 wherein said second end of said ejector lever does not contact said backplane board during rotation of said ejector lever.

8. An ejector for ejecting a riser card detachably connected to a backplane board, said ejector comprising:
an elongate ejector lever comprising a first end for rotatable attachment to said riser card and a second end for ejecting said riser card by inducing rotation of said ejector lever about a pivot section disposed between said first and second ends of said ejector lever, said pivot section of said ejector lever comprises a rotation pin for providing a point of rotation of said ejector lever; and
an elongate support post comprising a first end for contacting said backplane board and a second end rotatably supporting said ejector lever at said pivot section of said ejector lever wherein said second end comprises a retainer for securing said pivot section of said ejector lever during rotation.

9. The ejector of claim 8 wherein said retainer comprises a retention hook.

10. The ejector of claim 8 wherein said retainer comprises a retention fork.

11. The ejector of claim 8 wherein said first end of said support post comprises a card retention block for slidably securing said first end to said riser card.

12. The ejector of claim 8 wherein said second end of said ejector lever does not contact said backplane board during rotation of said ejector lever.

13. A system for facilitating the use of printed circuit boards in electronic devices, said system comprising:
a backplane board;
a riser card detachably connected to said backplane board;
an elongate ejector lever comprising a first end attached to said riser card and a second end for ejecting said riser card by inducing rotation of said ejector lever about a pivot section disposed between said first and second ends of said ejector lever; and
an elongate support post comprising a first end in contact with said backplane board and a second end rotatably supporting said ejector lever at said pivot section of said ejector lever.

14. The ejector of claim 13 wherein said pivot section of said ejector lever comprises a rotation pin for providing a point of rotation of said ejector lever.

15. The ejector of claim 13 wherein said second end of said support post comprises a retention hook for securing said pivot section of said ejector lever during rotation.

16. The ejector of claim 13 wherein said second end of said support post comprises a retention fork for securing said pivot section of said ejector lever during rotation.

17. The ejector of claim 13 wherein said first end of said ejector lever is rotatably attached to a slot in said riser card.

18. The ejector of claim 13 wherein said first end of said support post is slidably secured to said riser card by a card retention block that extends through and behind a retention slot in said riser card.

19. A method for separating a backplane board from a detachable riser card, said method comprising the following steps:
forming an elongated lever comprising a first end, a second end and a pivot section between said first and second ends;
forming an elongated post having first and second ends;
rotatably affixing said first end of said lever to said riser card;
positioning said post so that said first end of said post contacts the backplane board and said second end of said post rotatably supports the pivot section of said lever;
applying force to the second end of said lever so that said lever rotates about said pivot section, said first end of said lever applies ejection force to said riser card, and said riser card separates from said backplane board.

* * * * *